(12) United States Patent
Ogawa et al.

(10) Patent No.: US 10,122,299 B2
(45) Date of Patent: Nov. 6, 2018

(54) POWER CONVERSION DEVICE

(71) Applicant: Hitachi, Ltd., Chiyoda-ku, Tokyo (JP)

(72) Inventors: Takashi Ogawa, Tokyo (JP); Kimihisa Furukawa, Tokyo (JP); Junichi Sakano, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 15/563,964

(22) PCT Filed: Apr. 8, 2015

(86) PCT No.: PCT/JP2015/060903
§ 371 (c)(1),
(2) Date: Oct. 3, 2017

(87) PCT Pub. No.: WO2016/162960
PCT Pub. Date: Oct. 13, 2016

(65) Prior Publication Data
US 2018/0138830 A1    May 17, 2018

(51) Int. Cl.
| H02M 1/08 | (2006.01) |
| H02M 11/00 | (2006.01) |
| G01R 31/36 | (2006.01) |
| G08C 19/36 | (2006.01) |
| G01R 31/44 | (2006.01) |

(Continued)

(52) U.S. Cl.
CPC .......... *H02M 11/00* (2013.01); *G01R 31/3606* (2013.01); *G01R 31/44* (2013.01); *G08C 19/36* (2013.01); *H02M 1/08* (2013.01); *H02M 1/32* (2013.01); *H02M 2001/0003* (2013.01); *H02M 2001/327* (2013.01)

(58) Field of Classification Search
CPC ..... H02M 11/00; H02M 2001/00; H02M 1/08
See application file for complete search history.

(56) References Cited

U.S. PATENT DOCUMENTS

| 2010/0123945 A1* | 5/2010 | Kai .......................... H03K 5/01 359/239 |
| 2014/0198549 A1 | 7/2014 | Safa et al. |
| 2014/0285002 A1 | 9/2014 | Onishi |

FOREIGN PATENT DOCUMENTS

| JP | 2008-54375 A | 3/2008 |
| JP | 2014-132829 A | 7/2014 |
| JP | 2014-187804 A | 10/2014 |

OTHER PUBLICATIONS

International Search Report (PCT/ISA/210) issued in PCT Application No. PCT/JP2015/060903 dated Jun. 16, 2015 with English translation (2 pages).

(Continued)

*Primary Examiner* — Timothy J Dole
*Assistant Examiner* — Ishrat Jamali
(74) *Attorney, Agent, or Firm* — Crowell & Moring LLP

(57) ABSTRACT

The present invention relates to a power conversion device in the power electronics field. An object of the present invention is to provide a technique of determining whether a switching element operates normally or not from a gate monitor signal of a power conversion device, and predicting a sign of a failure by obtaining the temperature of the switching element from a transient state of the switching voltage of the power conversion circuit as a component of the power conversion device without using a new signal path.

4 Claims, 2 Drawing Sheets

(51) Int. Cl.
*H02M 1/32* (2007.01)
*H02M 1/00* (2006.01)

(56) References Cited

OTHER PUBLICATIONS

Japanese-language Written Opinion (PCT/ISA/237) issued in PCT Application No. PCT/JP2015/060903 dated Jun. 16, 2015 (3 pages).

\* cited by examiner

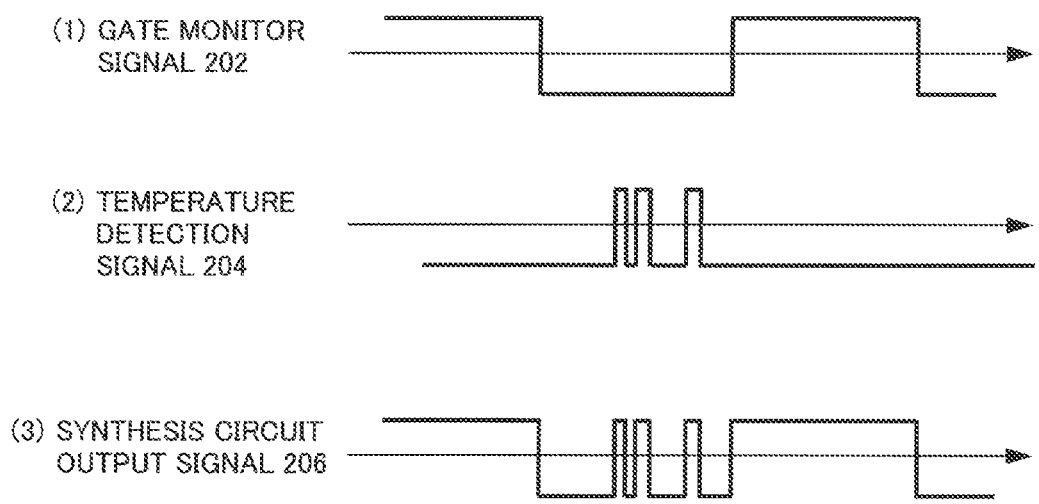

POWER CONVERSION DEVICE

TECHNICAL FIELD

The present invention relates to a power conversion device in a power electronics field.

BACKGROUND ART

In a power conversion device, in many cases, from the viewpoint of circuit protection, a high-voltage block and a low-voltage block are electrically separated from each other by using a communication medium such as a transformer or an optical module. Particularly, a configuration using an optical module is often used for industry since it is not easily influenced by noise. The operation rate of an industrial power conversion device is high and the causes of failures of the power conversion device are mainly an insulation failure and temperature abnormality in an inverter. In a power conversion circuit, in most of the cases, the failures are degradation failures by switching erroneous operation and accumulation of temperature abnormality of a switching element due to the switching erroneous operation. Patent literature 1 discloses an abnormality detecting method of generating a gate monitor signal (feedback signal) on the basis of gate voltage and gate current at the time of switching operation and diagnosing whether switching elements operate normally or not by a signal processing unit. In the method, when abnormality is detected, the operation of all of switching elements is forcedly stopped to protect the switching elements.

In the conventional art, however, a technique of determining whether switching elements operate normally from a gate monitor signal and calculating also the temperature of the switching elements without using a new signal path is not disclosed.

CITATION LIST

Patent Literature

Patent Literature 1: Japanese Patent Application Laid-Open No. 2008-54375

SUMMARY OF INVENTION

Technical Problem

An object of the present invention is to provide a technique of determining whether switching elements operate normally or not from a gate monitor signal of a power conversion device and obtaining the temperature of the switching elements from a transient state of switching voltage of a power conversion circuit as a component of the power conversion device without using a new signal path to predict a sign of a failure.

Solution to Problem

To achieve the object, the present invention provides a power conversion device including: a power conversion circuit performing power conversion by switching operation of a semiconductor switching element; a signal processing circuit controlling switching operation of the power conversion circuit; a gate drive circuit applying a drive signal to a control terminal of the power conversion circuit on the basis of an output signal of the signal processing circuit; a gate signal monitor circuit generating a monitor signal on the basis of drive voltage and drive current of the gate drive circuit; a filter circuit shaping an output signal of the gate monitor circuit; a voltage detection circuit detecting switching voltage of the power conversion circuit; a temperature detection circuit calculating temperature of the semiconductor switching element from the switching voltage from the voltage detection circuit and outputting a temperature detection signal; and an optical communication module transmitting a control signal from the signal processing circuit to the gate drive circuit and transmitting a gate monitor signal from the filter circuit to the signal processing circuit, and is characterized in that a synthesis circuit synthesizing the gate monitor signal and the temperature detection signal is provided between the filter circuit and the optical communication module, an optical module receiving a signal from the synthesis circuit, converting the signal to an optical signal, and transmitting the optical signal, and an optical module receiving the optical signal are provided, a separation circuit separating the optical signal to a gate monitor signal and a temperature detection signal is provided between the optical module receiving the optical signal and the signal processing circuit, and means which calculates temperature of the switching element on the basis of the temperature detection signal by the signal processing circuit is provided.

Further, the present invention is characterized in that, in the power conversion device, the synthesis circuit and the separation circuit synthesizes the gate monitor signal and the temperature detection signal by a time-division path switching circuit such as an SPDT (Single Pole Dual Throw) switch.

Advantageous Effects of Invention

According to the present invention, the temperature of an element in a power conversion circuit in the power conversion device can be detected by existing communication means, so that a sign of a failure can be grasped at low cost.

BRIEF DESCRIPTION OF DRAWINGS

FIG. 2 illustrates signal waveforms of a signal synthesis circuit.

DESCRIPTION OF EMBODIMENTS

Figure 1:
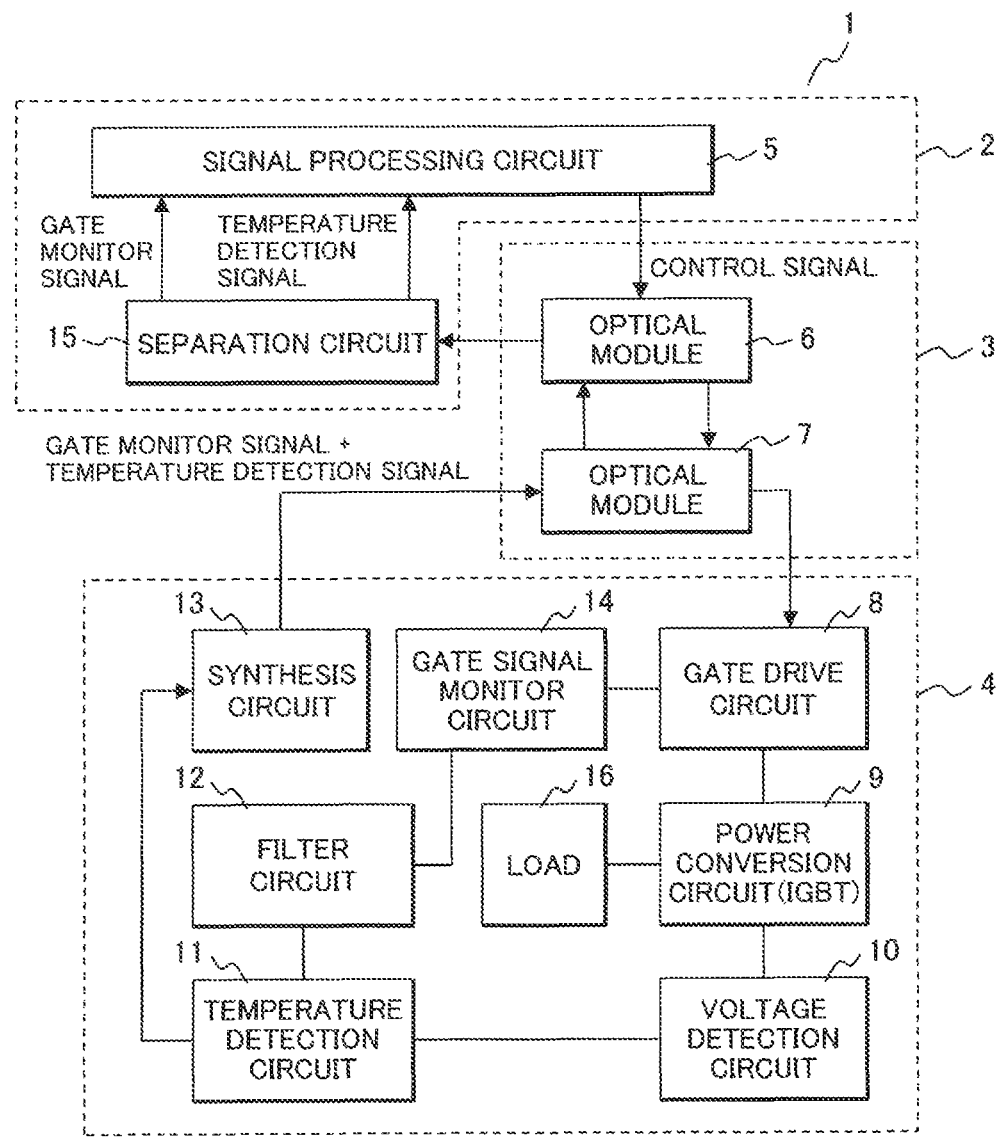
FIG. 1 illustrates a power conversion device according to a first embodiment of the present invention.

Hereinbelow, semiconductor modules in a power conversion device according to the present invention and a power conversion device will be described in detail with reference to embodiments using the drawings.

First Embodiment

FIG. 1 illustrates a first embodiment of the present invention. A power conversion device 1 has a low-voltage block 2, a communication block 3, and a high-voltage block 4. The low-voltage block 2 has a signal processing circuit 5 and a signal separation circuit 15, the communication block 3 has an optical transmission/reception module 6 on the low-voltage block side and an optical transmission/reception module 7 on the high voltage side, and the high-voltage block 4 has a gate drive circuit 8, a power conversion circuit 9, a voltage detection circuit 10, a temperature detection circuit 11, a filter circuit 12, a signal synthesis circuit 13, and a load 16.

A control signal generated by the signal processing circuit 5 is voltage-converted by the gate drive circuit 8 via the optical modules 6 and 7 to generate electric charges sufficient to drive a semiconductor element (IGBT) as a component of the power conversion circuit 9. At this time, a gate signal monitor circuit 14 generates a gate monitor signal 202 illustrated in FIG. 2 determining whether a semiconductor element performs switching operation without a problem from voltage and current applied to a control terminal of the semiconductor element and the power conversion circuit 9 operates normally or not. Voltage is generated between current input/output terminals of the switching element in the power conversion circuit 9. The voltage detection circuit 10 detects transient voltage and steady voltage of the semiconductor element at the time of switching and is usually used to detect whether there is abnormality in the voltage in the steady state. The temperature detection circuit 11 extracts turn-off time at the time of switching as the transient state. When the temperature of the switching element becomes higher, turn-off time is delayed. Consequently, the temperature of the element can be known from the delay amount. A temperature detection signal 204 illustrated in FIG. 2, which is output from the temperature detection circuit 11 is a signal obtained by converting the turn-off time to a digital signal by an AD conversion circuit or the like.

The temperature detection signal 204 is synthesized with the gate monitor signal 202 as an output signal from the gate signal monitor circuit 14 by the signal synthesis circuit 13, and the synthesized signal is supplied as a signal synthesis circuit output signal 206 via the optical modules 6 and 7 to the signal separation circuit 15 in the low-voltage block 2. The signal separation circuit 15 separates the signal into the gate monitor signal 202 and the temperature detection signal 204 which are supplied to the signal processing circuit 5. By the gate monitor signal 202, abnormality is detected like in the conventional technique, turn-off time is demodulated from the temperature detection signal 204, and the temperature of the switching element is calculated on the basis of a correlation equation of the turn-off time and temperature, a lookup table, and the like in the signal processing circuit. The presence/absence of abnormality is determined by using the calculated temperature of the switching element.

Second Embodiment

Next, a second embodiment of the present invention will be described. According to the foregoing first embodiment, the signal synthesis circuit output signal 206 output from the signal synthesis circuit 13 is transmitted between the optical modules 6 and 7, and the signal synthesis circuit output signal 206 has the information of the pulse width and the pulse interval only. On the other hand, according to the second embodiment of the present invention, the signal transmitted between the signal synthesis circuit 13 and the signal separation circuit 15 can be constructed by an SPDT switch capable of switching transmission paths in a time division manner. By switching the timing of transmitting the gate monitor signal 202 and the timing of transmitting the temperature detection signal 204 in time and transmitting the signals, the gate monitor signal 202 and the temperature detection signal 204 are synthesized or separated. By a configuration similar to that of the foregoing first embodiment, calculation of the temperature of the switching element can be realized from the gate monitor signal 202 and the temperature detection signal 204.

As described above, according to the second embodiment of the present invention, in a manner similar to the first embodiment, the temperature of the switching element is calculated, and abnormality in the switching element can be detected.

INDUSTRIAL APPLICABILITY

By applying the present invention to a power conversion device in the power electronics field, prediction of a sign of a failure can be realized.

REFERENCE SIGNS LIST

1 . . . voltage conversion device
2 . . . low-voltage block
3 . . . communication block
4 . . . high-voltage block
5 . . . signal processing circuit
6,7 . . . optical modules
8 . . . gate drive circuit
9 . . . power conversion circuit
10 . . . voltage detection circuit
11 . . . temperature detection circuit
12 . . . filter circuit
13 . . . signal synthesis circuit
14 . . . gate monitor circuit
15 . . . signal separation circuit

The invention claimed is:
1. A power conversion device comprising:
a power conversion circuit performing power conversion by switching operation of a semiconductor switching element;
a signal processing circuit controlling switching operation of the power conversion circuit;
a gate drive circuit applying a drive signal to a control terminal of the power conversion circuit on the basis of an output signal of the signal processing circuit;
a gate signal monitor circuit generating a monitor signal on the basis of drive voltage and drive current of the gate drive circuit;
a filter circuit shaping an output signal of the gate monitor circuit;
a voltage detection circuit detecting switching voltage of the power conversion circuit;
a temperature detection circuit calculating temperature of the semiconductor switching element from the switching voltage from the voltage detection circuit and outputting a temperature detection signal; and
an optical communication module transmitting a control signal from the signal processing circuit to the gate drive circuit and transmitting a gate monitor signal from the filter circuit to the signal processing circuit,
wherein a synthesis circuit synthesizing the gate monitor signal and the temperature detection signal is provided between the filter circuit and the optical communication module,
wherein an optical module receiving a signal from the synthesis circuit, converting the signal to an optical signal, and transmitting the optical signal, and
an optical module receiving the optical signal are provided,
wherein a separation circuit separating the optical signal to a gate monitor signal and a temperature detection signal is provided between the optical module receiving the optical signal and the signal processing circuit, and wherein means which calculates temperature of the switching element on the basis of the temperature detection signal by the signal processing circuit is provided.

2. The power conversion device according to claim 1, wherein the synthesis circuit and the separation circuit synthesizes the gate monitor signal and the temperature detection signal by a time-division path switching circuit.

3. A power conversion device comprising:
a power conversion circuit performing power conversion by switching operation of a semiconductor switching element;
a signal processing circuit controlling switching operation of the power conversion circuit;
a gate drive circuit applying a drive signal to a control terminal of the power conversion circuit on the basis of an output signal of the signal processing circuit;
a gate signal monitor circuit generating a monitor signal on the basis of drive voltage and drive current of the gate drive circuit;
a filter circuit shaping an output signal of the gate monitor circuit;
a voltage detection circuit detecting switching voltage of the power conversion circuit;
a temperature detection circuit calculating temperature of the semiconductor switching element from the switching voltage from the voltage detection circuit and outputting a temperature detection signal; and
an optical communication module transmitting a control signal from the signal processing circuit to the gate drive circuit and transmitting a gate monitor signal from the filter circuit to the signal processing circuit,
wherein a synthesis circuit synthesizing the gate monitor signal and the temperature detection signal is provided between the filter circuit and the optical communication module,
wherein an optical module receiving a signal from the synthesis circuit, converting the signal to an optical signal, and transmitting the optical signal, and
an optical module receiving the optical signal are provided,
wherein a separation circuit separating the optical signal to a gate monitor signal and a temperature detection signal is provided between the optical module receiving the optical signal and the signal processing circuit, and
wherein the signal processing circuit calculates temperature of the switching element on the basis of the temperature detection signal.

4. The power conversion device according to claim 3, wherein the synthesis circuit and the separation circuit synthesize the gate monitor signal and the temperature detection signal by a time-division path switching circuit.

* * * * *